(12) United States Patent
Andersen

(10) Patent No.: US 11,611,286 B2
(45) Date of Patent: Mar. 21, 2023

(54) METHOD FOR DETERMINING RECTIFIER-STAGE OUTPUT CURRENT OR GRID-SIDE CURRENTS OF A FREQUENCY CONVERTER

(71) Applicant: Danfoss Power Electronics A/S, Gråsten (DK)

(72) Inventor: Henrik Rosendal Andersen, Graasten (DK)

(73) Assignee: Danfoss Power Electronics A/S, Gråsten (DK)

( * ) Notice: Subject to any disclaimer, the term of this patent is extended or adjusted under 35 U.S.C. 154(b) by 191 days.

(21) Appl. No.: 16/935,474

(22) Filed: Jul. 22, 2020

(65) Prior Publication Data

US 2021/0028715 A1   Jan. 28, 2021

(30) Foreign Application Priority Data

Jul. 23, 2019 (DE) .......................... 102019119868.2

(51) Int. Cl.
*H02M 5/458* (2006.01)
*H02M 1/08* (2006.01)
*H02M 1/00* (2006.01)

(52) U.S. Cl.
CPC ............. *H02M 5/458* (2013.01); *H02M 1/08* (2013.01); *H02M 1/0009* (2021.05)

(58) Field of Classification Search
CPC .... H02M 5/458; H02M 5/293; H02M 5/2932; H02M 1/0009; H02M 1/08; H02M 1/44; H02M 1/00; G01R 19/0092; G01R 19/22
See application file for complete search history.

(56) References Cited

U.S. PATENT DOCUMENTS

| 4,520,298 | A  | * | 5/1985 | Abbondanti | ........... | G01R 19/25 |
| | | | | | | 318/811 |
| 7,742,321 | B2 | * | 6/2010 | Komulainen | ......... | H02M 5/458 |
| | | | | | | 363/37 |

(Continued)

FOREIGN PATENT DOCUMENTS

| DE | 102004030532 A1 | 1/2006 |
| DE | 102008042978 A1 | 4/2010 |

(Continued)

*Primary Examiner* — Jue Zhang
*Assistant Examiner* — Jye-June Lee
(74) *Attorney, Agent, or Firm* — McCormick, Paulding & Huber PLLC

(57) ABSTRACT

A method for determining rectifier-stage output current and/or grid-side currents (iu, iv, iw) of a frequency converter (1) having a passive rectifier (3), an inverter (4), a DC-link with a DC-link inductor (Ldc) and a DC-link capacitor (Cdc) between the rectification stage (3) and the inverter stage (4) is described. In a frequency converter the current information for the grid-side currents (iu, iv, iw) should be obtained without a current sensor at the grid-side (2). To this end the method comprises the step of calculating a current in the DC-link (5) by using at least a voltage value (Urec) and characteristics of the rectifier (3) in the DC-link (5) and/or grid side currents to form a corrected current using the calculated current and a measured current or currents or a fraction of a measured current or currents, or a fraction of a measured current or currents.

23 Claims, 1 Drawing Sheet

(56) References Cited

U.S. PATENT DOCUMENTS

| | | | | |
|---|---|---|---|---|
| 2014/0233278 A1* | 8/2014 | Li | ....................... | H02M 5/458 |
| | | | | 363/37 |
| 2014/0328091 A1* | 11/2014 | Sakakibara | ........... | H02M 5/458 |
| | | | | 363/37 |
| 2018/0088154 A1 | 3/2018 | Zimmermann | | |

FOREIGN PATENT DOCUMENTS

| | | |
|---|---|---|
| DE | 102016203504 A1 | 9/2017 |
| DE | 102019119868 B3 | 11/2020 |
| EP | 1936794 A2 | 6/2008 |
| EP | 3199929 A1 | 8/2017 |

\* cited by examiner

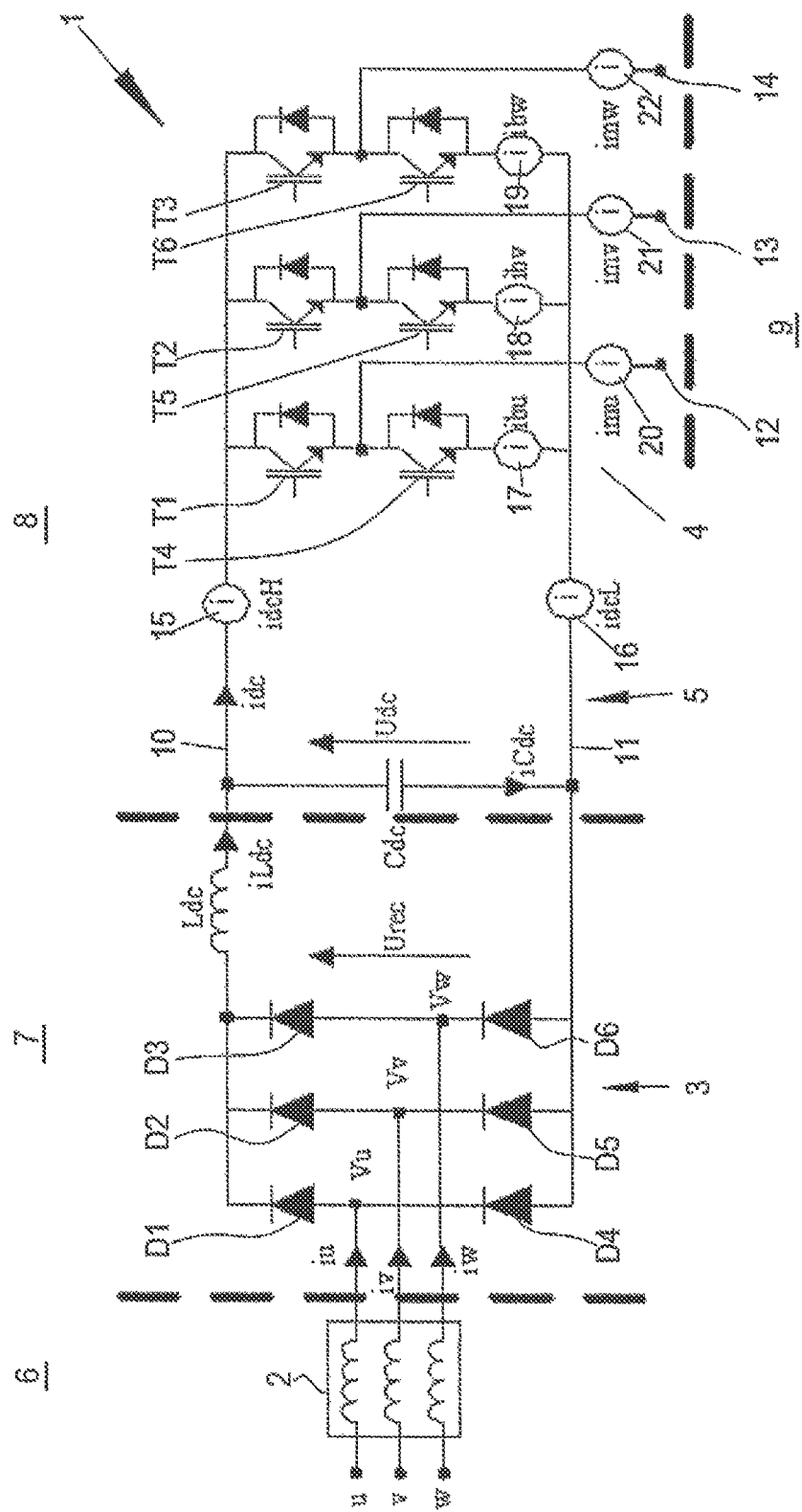

METHOD FOR DETERMINING RECTIFIER-STAGE OUTPUT CURRENT OR GRID-SIDE CURRENTS OF A FREQUENCY CONVERTER

CROSS-REFERENCE TO RELATED APPLICATION

This application claims foreign priority benefits under 35 U.S.C. § 119 to German Patent Application No. 102019119868.2 filed on Jul. 23, 2019, the content of which is hereby incorporated by reference in its entirety.

TECHNICAL FIELD

The present invention relates to a method for determining rectifier-stage output current and/or grid-side currents of a frequency converter having a passive rectifier, an inverter, a DC-Link with a DC-link inductor and a DC-link capacitor between the rectifier and the inverter and/or an AC-inductor at the grid side of the rectification stage.

BACKGROUND

A frequency converter is usually used to convert electrical input power supplied from a grid with a predetermined frequency to an electric output power having another frequency, which can be controlled. Currents and voltages supplied from the grid-side are rectified by the rectification stage and smoothed to a certain extent in the DC-link by the DC-link capacitor, the DC-link inductor and/or the AC-inductor at the grid side. The direct voltage and current in the DC-link are then converted in a controlled manner by the inverter stage into AC voltages and currents.

A frequency converter with a passive rectification stage is interesting, as it exhibits lower cost than a controlled PWM rectification stage.

In many cases the user of such a frequency converter is interested in obtaining current information of the rectifier-side and/or grid-side current or currents. However, this requires current sensors which would negatively affect the cost level of the frequency converter and usually require some significant extra space. Such information can be used to assess the harmonic performance of the frequency converter acc. a European standard like IEC 61000-3-12 or to simply assess the thermal condition of the rectifier stage in general for protection and lifetime purposes.

SUMMARY

The object underlying the invention is to provide current information on the output current of the rectifier stage and/or grid-side currents without current sensors at the grid-side, rectifier stage and the rectifier-side of the DC-link.

This object is solved with a method as described at the outset, in that the method comprises the step of calculating a current in the rectifier side of the DC-link and/or grid-side currents by using voltage values and characteristics of the rectification stage to form a corrected current using the calculated current and a measured current or currents or a fraction of a measured current or currents.

Usually, the voltage values can easily be obtained, since voltage sensors are comparatively cheaper than current sensors and require less space. Since the rectification stage comprises a DC-link inductor and/or an AC-inductor and a DC-link capacitor, it is possible to use voltages at or over one or more of these parts to derive a current or currents in combination with a measured current or a fraction of a measured current, which is termed "corrected current" or "corrected currents" in order to facilitate the following explanation. The "corrected current" and/or "corrected currents" is an estimate of the current flowing at the output of the rectifier stage and/or an estimate of the grid-side currents.

In an embodiment of the invention the calculated current and/or the absolute value of the calculated grid-side currents each contains an AC component and a DC component, where each corrected current is determined by separating the calculated AC and DC components and then adjusting the calculated DC component by a measured current or a fraction of a measured current from the inverter side of the frequency converter.

In an embodiment of the invention the calculated current and/or currents contain an AC-component only, meaning that the corrected current and/or currents are obtained by adding a DC-component of a measured current from the inverter side of the frequency to the calculated current and/or currents.

In an embodiment of the invention a calculated current is obtained by using characteristics of the DC-inductor and measured voltages across the inductor. As an example, characteristics of the DC-inductor may be the inductance of the inductor. Another example may be the inductance of the inductor in combination with a series and/or a parallel resistance.

In an embodiment of the invention a calculated current is obtained by using characteristics of the DC-capacitor and measured voltages across the capacitor. As an example, characteristics of the DC-capacitor may be the capacitance of the capacitor. Another example may be the capacitance of the capacitor in combination with a series and/or parallel resistance.

In an embodiment of the invention a calculated current is obtained by using characteristics of the AC-inductor and measured voltages across the inductor. As an example, characteristics of the AC-inductor may be the inductance of the inductor. Another example may be the inductance of the inductor in combination with a series and/or a parallel resistance.

In an embodiment of the invention a calculated current is obtained by using characteristics of the DC-capacitor and characteristics of the DC-inductor and measured voltages across the components and/or characteristics of any other component in the rectifier side of the frequency converter. Examples of characteristics of the components are given in the three former embodiments of the invention. An example of characteristics of any other component in the rectifier side of the frequency converter is the on-state voltage drop of a rectifier silicone device in the rectification stage.

In an embodiment of the invention the calculated current is obtained by using both characteristics of the DC-capacitor and characteristics of the DC-inductor and/or characteristics of the AC-inductor and measured voltages across the components and/or characteristics of any other component in the rectifier stage of the frequency converter. Examples of characteristics of the components are given in the four former embodiments of the invention. An example of characteristics of any other component in the rectifier side of the frequency converter is the on-state voltage drop of a rectifier silicone device in the rectification stage. Another example is characteristics of the AC-inductor at the grid side.

In an embodiment of the invention a DC current is measured and used in combination with a calculated current, wherein the combination of the measured current and the calculated current forms the corrected current. At the inverter side of the frequency converter there are in many cases already current sensors, which are used for controlling the inverter stage. The information from such a current sensor or such current sensors can be used to derive the measured current. The measured current can be used, for example, to adjust the calculated current for inaccuracies in the voltage measurements, calculation models and component characteristics.

In an embodiment of the invention the DC-component or a fraction of the DC-component of the measured current from the inverter side of the frequency converter is used to adjust a calculated current.

In an embodiment of the invention a DC current is measured in at least one of the two inverter-side DC-link rails. Alternatively, a DC-current is measured by using current information from three of the legs of the inverter stage, or at least two of the outputs of the inverter stage. When the current is measured in either of these ways, an information about the total current flowing in the inverter-side of the DC-link can be obtained according to prior art.

In another embodiment of the invention an average value or DC-component of a calculated current is determined. A fraction of this average value and a fraction of the average value or DC-component of the measured current are used to adjust a calculated current to arrive at the corrected current.

In an embodiment of the invention an average value or DC-component or a fraction of these of a calculated current is derived, the average value or a DC-component or a fraction of these is subtracted from the calculated current, and an average value or a DC-component or a fraction of these of the measured DC current is added to the difference to form a corrected current.

In an embodiment of the invention the calculated current is derived by integrating a voltage drop over the DC-link inductance. The voltage drop over the DC-link inductance can be determined by measuring a voltage at the output side of the rectifier stage and a voltage downstream the DC-link inductance, for example a voltage over the DC-link capacitor. The product of the inverse inductance of the inductance and the integral of the voltage over time leads to the calculated current. This is in some cases sufficient to arrive at the corrected current. However, when model inaccuracies or errors during the voltage measurement are too large, then a drift could occur during integration. In this case it is particularly advantageous to correct the calculated current using the measured current.

In an embodiment of the invention the voltage drop is calculated from a difference between an output voltage of the rectifier stage and a DC-link voltage. The DC-link voltage can be measured, for example, over the DC-link capacitor.

In an embodiment of the invention the output voltage of the rectifier stage is calculated from an instantaneous maximum value minus an instantaneous minimum value of the grid voltages at the input side of the rectifier stage. As mentioned above, a voltage measurement can be performed with low costs, even at the input side of the rectifier stage.

In an embodiment of the invention a calculated current per grid phase is derived by integrating the voltage drop over the AC inductor in each grid phase. A voltage drop over the AC-inductor per phase can be determined by a measurement. The product of the inverse inductance of the AC-inductor and the integral of the voltage over time leads to the calculated current. This is in some cases sufficient to arrive at a corrected current. However, when model inaccuracies or errors during the voltage measurement are too large, then a drift could occur during integration. In this case it is particularly advantageous to correct a calculated current using a fraction of the measured current. As the calculated current in this embodiment of the invention is an AC-current, the absolute value of the calculated current shall be used for the correction step using the measured DC-current of the inverter-side of the frequency converter.

Alternatively, instead of integrating the voltage drop over AC inductor in each phase, a 2-phase vectorial representation of the voltage drop can be made in a manner known in the art. From this vectorial representation a calculated current can be determined.

In a further embodiment of the invention the calculated current is derived by differentiating the voltage over the DC-link capacitor and multiplying with the capacitance of the capacitor, and the calculated current and an average value of the measured current are added to form the corrected current. This is another possibility to obtain the ripple of the DC-link current. This does involve some life-time considerations, as the DC-capacitance varies over the life of the frequency converter. Also, the principle of differentiation is considered less robust compared with integration.

In an embodiment of the invention the zero-crossings of the grid-voltages are used to derive each grid phase current from a corrected current representing the output current of the rectifier stage. The zero-crossings indicate which of the phases of the passive rectifier stage are conducting, and which are not conducting. This is a simple way to distribute the corrected current representing the output current of the rectifier stage over the grid phases.

In a further embodiment of the invention the phase of the measured grid voltage vector is detected to derive each grid phase current from a corrected current representing the output current of the rectifier stage. The phase angle of the rotating grid-voltage vector indicates which of the phases of the passive rectifier stage are conducting, and which are not conducting. This is a simple way to distribute the corrected current representing the output current of the rectifier stage over the grid phases.

In an embodiment of the invention an information obtained from the calculated current or from the corrected current and a grid-voltages are used to calculate at least one of imbalance, voltage distortion, RMS values, and THD values. In many cases at least one of these data is interesting for a user of a frequency converter. In many cases the user is interested in more than one information.

In an embodiment of the invention an information obtained from the corrected current or from the corrected current and a grid-side voltage are used for protection and/or life-time estimation of the frequency converter or at least a component of the frequency converter. In this way maintenance and repair of the frequency converter can reliably be planned.

BRIEF DESCRIPTION OF THE DRAWINGS

An embodiment of the invention is now described in more detail with reference to the drawing, in which the enclosed FIGURE shows a schematic illustration of a circuit diagram of a three-phase frequency converter.

DETAILED DESCRIPTION

A frequency converter 1 is connected to a grid 6 having three phases u, v and w. The grid exhibits some grid impedance 2 per phase. Alternatively, the grid impedance block 2 could represent an integrated AC-inductor of the frequency converter block 1.

In order to facilitate the following explanation, the circuit diagram is divided in a grid side 6, a rectifier stage 7, an inverter stage 8 and a motor side 9.

The rectifier stage 7 comprises a passive rectifier 3. The passive rectifier 3 is formed of rectifier silicone devices, such as diodes D1-D6, which are generally known in the art. Alternatively, the diodes could be thyristors used for inrush current limitation in some frequency converters. The rectifier 3 shown is a 3-phase rectifier but could also be a single phase rectifier or another multi-phase rectifier. A DC-link inductance Ldc is connected to an output side of the rectifier 3. Alternatively, two DC-chokes in both the low-side and high-side rails could be the case. Two DC-chokes increase the complexity of the voltage-sensing means, which is irrelevant for the present invention. A DC-link capacitor Cdc is connected between a positive rail 10 and a negative rail 11 of the DC-link 5 downstream the DC-link inductor Ldc. The DC-capacitor may physically be applied as several capacitors in series in a frequency converter, which is irrelevant for the present invention.

The inverter 4 comprises six controlled switches T1-T6, wherein each of the switches T1-T6 is associated with an anti-parallel diode.

The inverter 4 comprises three outputs 12, 13, 14, wherein each of the outputs 12-14 is connected to a point between two switches T1, T4; T2, T5; T3, T6, as it is known in the art. The inverter 4 could have more or less than three phase outputs. Means for controlling the switches are not shown, as this is irrelevant for the present invention.

The three phases u, v, w of the grid 2 supply a current iu, iv, iw and a voltage Vu, Vv, Vw to points between each pair of diodes D1, D4; D2, D5, D3, D6. Voltages and currents are rectified in the rectifier 3, so that the output of the rectifier 3 give a pulsating output DC voltage Urec, as known in the art. This output voltage Urec can be measured easily. It can, however, also be calculated by the instantaneous maximum value minus the instantaneous minimum value of the voltage differences between voltage potentials Vu, Vv, Vw at the grid-side 6 of the rectifier 3, when these are measured. This gives a complex sense circuitry compared to measuring Urec.

The rectifier stage 7 outputs a direct current iLdc which passes through the DC-link inductor Ldc. The DC-link inductor Ldc together with a DC-link capacitor Cdc smoothen the current iLdc. However, a ripple remains, which flows in the capacitor Cdc together with ripple current induced by the inverter stage associated with the current idc. The remainder of the inductor current, which essentially means its average value, is supplied to the inverter stage 4 via the positive rail 10 and returned via the negative rail 11 to the rectifier stage 3. At a given time instant the current iLdc equals the sum of the currents iCdc and idc shown in the FIGURE according to the law of Kirchhoff. In steady-state the current iCdc is zero averagely.

The circuit diagram shows a current idc through the positive rail 10 of the DC-link 5, currents ibu, ibv, ibw in each of the inverter legs, currents imu, imv, imw in each of the outputs of the inverter stage 4 and a current iCdc through the DC-link capacitor Cdc.

Each of these currents can be measured by respective current sensors 15-22, wherein the current idc through the DC-link can be measured in the positive rail (idcH) or in the negative rail (idcL).

It should be noted, however, that not all of the current sensors 15-22 are necessary in a minimum configuration. Only a current sensor 15 or 16 in the DC-link is sufficient or the current sensors 17-19 in the legs of the inverter stage 4 or two of the current sensors 20-22 in the outputs 12-14 of the inverter stage 4 would be sufficient.

If voltage measurements of the voltages Urec, Udc and the DC-link component model are precise enough, the current sensors 15-22 can be omitted theoretically, considering the present invention. However, it is rather difficult to perform a voltage measurement with the necessary accuracy.

A first way to determine grid-side currents iu, iv, iw at the grid-side 2 of the frequency dc converter 1 is to calculate the current iLdc through the DC-link inductance. This can easily be done by forming a difference between the voltage Urec at the output of the rectifier stage 3 and the voltage Udc over the DC-link capacitor. This difference is the voltage drop over the DC-link inductor Ldc. By integrating this voltage drop over time and dividing it by the inductance of the DC-link inductor Ldc it is theoretically possible to calculate the current which is drawn by the inverter stage 3. In many cases, however, the measurement or determination of the voltages Urec and Udc is not precise enough, so that such an integration would lead to a drift, in extreme cases to positive or negative infinity. Also, characteristics of component models may be inaccurate. In order to avoid this problem, an average of the calculated current is formed. This average is subtracted from the calculated current, so that any drift will be eliminated and only the information about the "ripple" of the current remains. In order to get the true current information for the rectification stage 3, "the corrected current", the current idc through the DC-link 5 is measured by one or more of the current sensors 15-22. The average of the measured current is added to the difference of the calculated current and the average of the calculated current. Alternatively, a fraction of the difference between the two averages are used to arrive at the corrected current. Those skilled in the art may acknowledge this is equivalent to a proportional controller with a gain Kp less than unity. Equivalently, in the first case the gain Kp of the proportional controller is unity. Hence, the compensation equation can be described like ILdc_corrected=ILdc+Kp*(Idc_average−ILdc_average).

Using a Kp less than unity gives an error in the DC component of the corrected current, when the average value of the calculated current is not sufficiently precise. Hence, as an alternative the term "fraction" in the present invention may relate to the use of a controller including an integration function, such as the well-known PI controller or a PID controller, etc. In this case the integration function of the employed controller eliminates the error introduced, when using a Kp less than unity in the above equation.

Alternatively or additionally, the current can also be calculated by using the current iCdc through the DC-link capacitor Cdc. To this end, the voltage Udc over the DC-link capacitor Cdc can be differentiated to calculate the current iCdc through the DC-link capacitor Cdc. In this case, the average of the measured DC-link current idc is added to this calculated current iCdc to obtain the "true" value of the current to the rectifier stage 3.

It should be noted that the inventive method can be used as well when the DC-link inductor Ldc exhibits an ohmic series resistance or is connected in series with a resistor. In this case, the voltage drop of the resistor shall be subtracted from the measured voltage drop of the inductor before the integration is started. Accordingly, it is possible to consider the DC-link inductor Ldc as a combination of an inductance and an ohmic resistance.

It is furthermore assumed that an average of the current iCdc is zero which is justified in a steady state operation. However, dynamic simulations show that the method can be applied as well with good accuracy if the average of the current iCdc through the DC-link capacitor Cdc is not zero during transient sequences. It is accordingly not necessary to complicate the model, even though this is covered by the invention, as both Ldc and Cdc may be used simultaneously in a dynamic model to improve the corrected current transiently.

Based on the above corrected current ILdc the grid phase currents can be computed by detecting the zero crossings or the phase of the grid voltages.

Alternatively or equivalently to the above DC-inductor approach, the grid currents iu, iv and iw may be calculated directly by using characteristics of an AC inductor at the grid side in the FIGURE along with measured voltage drops across it. Again, a drift may occur, which is compensated equivalently using the average of the current idc. As each grid phase conducts in ⅔ of the time, the applied average of the idc shall be scaled accordingly in this case.

When the calculated current and/or the absolute value of the calculated grid-side current each contain an AC component and a DC component, each corrected current is determined by separating the calculated AC and DC components and then adjusting the calculated DC component by a measured current or a fraction of a measured current from the inverter side of the frequency converter.

In some cases, the calculated current and/or currents contain an AC component only. This means that the corrected current and/or currents are obtained by adding a DC component of a measured current from the inverter side of the frequency to the calculated current and/or currents.

It is also possible to obtain a calculated current by using characteristics of the DC inductor and measured voltages across the inductor. A characteristic of the DC inductor may be the inductance of the inductor. Another example may be the inductance of the inductor in combination with a series and/or a parallel resistance.

A further possibility is that the calculated current is obtained by using characteristics of the DC capacitor and measured voltages across the capacitor. A characteristic of the DC capacitor may be the capacitance of the capacitor alone or a combination of the capacitance of the capacitor in combination with a series and/or parallel resistance.

A further possibility to obtain a calculated current is to use characteristics of the AC inductor and measured voltages across the inductor. The characteristics of the AC inductor may be the inductance of the inductor or the inductance of the inductor in combination with a series and/or a parallel resistance.

The calculated current may furthermore be obtained by using characteristics of the DC-capacitor and characteristics of the DC inductor and measured voltages across the components and/or characteristics of any other component in the rectifier side of the frequency converter. The characteristics of the component may be the same as mentioned above.

The calculated current may be obtained by using both characteristics of the DC capacitor and characteristics of the DC inductor and/or characteristics of the AC inductor and measured voltages across the components and/or characteristics of any other component in the rectifier stage of the frequency converter. The characteristics may be the same as mentioned above.

The calculated current can furthermore be adjusted by using the DC component or a fraction of the DC component of the measured current from the inverter side of the frequency converter.

The calculated current per grid phase may furthermore be derived by integrating the voltage drop over the AC inductor in each grid phase. A voltage drop over the AC inductor per phase can be determined by a measurement. The product of the inverse inductance of the AC inductor and the integral of the voltage over time leads to the calculated current. This is in some cases sufficient to arrive at a corrected current. However, a drift could occur during integration, when model inaccuracies or error during the voltage measurement are too large. In this case it is of advantage to correct a calculated current using a fraction of the measured current. As the calculated current in this embodiment is an AC current, the absolute value of the calculated current shall be used for the correction step using the measured DC current of the inverter side of the frequency converter.

It is furthermore possible to detect the phase of the measured grid voltage vector to derive each grid phase current from a corrected current representing the output current in the rectifier stage. The phase angle of the rotating grid-voltage vector indicates which of the phases of the passive rectifier stage are conducting, and which are not conducting. This is a simple way to distribute the corrected current representing the output current of the rectifier stage over the grid phases.

While the present disclosure has been illustrated and described with respect to a particular embodiment thereof, it should be appreciated by those of ordinary skill in the art that various modifications to this disclosure may be made without departing from the spirit and scope of the present disclosure.

What is claimed is:

1. A method for determining rectifier-stage output current or grid side currents of a frequency converter having a passive rectifier, an inverter, a DC-link with a DC-link inductor and a DC-link capacitor between the passive rectifier and the inverter or an AC-inductor at a grid side of the rectifier-stage, wherein the method comprises a step of calculating a current in the DC-link or grid side currents by using at least a voltage value and characteristics of the rectifier-stage or the DC-link to form a corrected current using the calculated current in the DC-link or the calculated grid side currents and a measured current or currents, or a fraction of the measured current or currents.

2. The method according to claim 1, wherein the calculated current in the DC-link or an absolute value of the calculated grid side currents each contains an AC component and a DC component, where each corrected current is determined by separating the AC and DC components and then adjusting the DC component by the measured current or a fraction of the measured current from an inverter side of the frequency converter.

3. The method according to claim 2, wherein the calculated current in the DC-link is derived by differentiating a voltage across the DC-link capacitor, and the calculated current in the DC-link and an average value of the measured current are added to form the corrected current.

4. The method according to claim 1, wherein the calculated current in the DC-link or the calculated grid side currents contain an AC component only, meaning that the corrected current or currents are obtained by adding a DC component of a measured current from an inverter side of the frequency converter to the calculated current or currents.

5. The method according to claim 1, wherein the calculated current in the DC-link is obtained by using characteristics of the DC-link inductor and measured voltages across the DC-link inductor.

6. The method according to claim 1, wherein the calculated current in the DC-link is obtained by using characteristics of the DC-link capacitor and measured voltages across the DC-link capacitor.

7. The method according to claim 1, wherein the calculated current in the DC-link is obtained by using characteristics of the AC-inductor and measured voltages across the AC-inductor.

8. The method according to claim 1, wherein the calculated current in the DC-link is obtained by using characteristics of the DC-link capacitor and characteristics of the DC-link inductor and measured voltages across the DC-link capacitor and the DC-link inductor or characteristics of any other component in the rectifier-stage of the frequency converter.

9. The method according to claim 1, wherein the calculated current in the DC-link is obtained by using both characteristics of the DC-link capacitor and characteristics of the DC-link inductor or characteristics of the AC-inductor and measured voltages across the components or characteristics of any other component in the rectifier-stage of the frequency converter.

10. The method according to claim 1, wherein a DC current is measured and used in combination with the calculated current in the DC-link, wherein the combination of the measured current and the calculated current in the DC-link form the corrected current.

11. The method according to claim 10, wherein a DC-component of the measured current from the inverter of the frequency converter or a fraction of the DC-component of the measured current from the inverter side of the frequency converter is used to adjust the calculated current in the DC-link.

12. The method according to claim 10, wherein the DC current is measured in one of two inverter-side DC-link rails, at least two legs of the inverter, or at least two outputs of the inverter.

13. The method according to claim 10, wherein an average value or a DC-component of the calculated current in the DC-link is determined.

14. The method according to claim 10, wherein an average value or a DC-component or a fraction of the average value or the DC-component of the calculated current is derived, the average value or the DC-component or the fraction of the average value or the DC-component is subtracted from the calculated current, and an average value or a DC-component or a fraction of the average value or the DC-component of the measured DC current is added to a difference between the calculated current and the average value or the DC-component or the fraction of the average value or the DC-component to form a corrected current.

15. The method according to claim 1, wherein the calculated current in the DC-link is derived by integrating a voltage drop across the DC-link inductor.

16. The method according to claim 15, wherein the voltage drop is calculated from a difference between an output voltage of the rectifier-stage and a DC-link voltage.

17. The method according to claim 16, wherein the output voltage of the rectifier-stage is calculated from an instantaneous maximum value minus an instantaneous minimum value of grid voltages at an input side of the rectifier-stage.

18. The method according to claim 17, wherein a calculated current per grid phase is derived by integrating a voltage drop over the AC-inductor in each grid phase.

19. The method according to claim 1, wherein zero-crossings of line-line grid voltages are used to derive each grid phase current from the corrected current representing the rectifier-stage output current.

20. The method according to claim 1, wherein a phase of a measured grid voltage vector is detected to derive each grid phase current from the corrected current representing the rectifier-stage output current.

21. The method according to claim 1, wherein information obtained from the calculated current or from the corrected current and grid-voltages is used to calculate at least one of imbalance, voltage distortion, RMS values, and THD values.

22. The method according to claim 1, wherein information obtained from the corrected current or from the corrected current and a grid-side voltage is used for protection or life-time estimation of the frequency converter or components of the frequency converter.

23. The method according to claim 1, wherein the measured current or currents are measured by at least one current sensor.

* * * * *